United States Patent
Wang et al.

(10) Patent No.: US 9,406,735 B2
(45) Date of Patent: Aug. 2, 2016

(54) ORGANIC LIGHT-EMITTING DISPLAY APPARATUS WITH ENHANCED LIGHT OUTPUT EFFICIENCY AND MANUFACTURING METHOD THEREOF

(71) Applicant: Samsung Display Co., Ltd., Yongin, Gyeonggi-Do (KR)

(72) Inventors: Seong-Min Wang, Yongin (KR); Jung-Gun Nam, Yongin (KR); Dae-Young Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 14/226,738

(22) Filed: Mar. 26, 2014

(65) Prior Publication Data
US 2015/0162390 A1    Jun. 11, 2015

(30) Foreign Application Priority Data
Dec. 10, 2013   (KR) .................. 10-2013-0153209

(51) Int. Cl.
*H01L 27/32* (2006.01)
*H01L 51/52* (2006.01)
*H01L 51/56* (2006.01)

(52) U.S. Cl.
CPC .......... *H01L 27/326* (2013.01); *H01L 51/5271* (2013.01); *H01L 51/56* (2013.01); *H01L 51/5293* (2013.01)

(58) Field of Classification Search
CPC ............ H01L 27/3206; H01L 27/3211; H01L 51/5271; H01L 51/5275; H01L 51/5293
USPC .......................................... 257/98
See application file for complete search history.

(56) References Cited

U.S. PATENT DOCUMENTS

| | | | |
|---|---|---|---|
| 8,629,472 B2* | 1/2014 | Seo et al. .......... | 257/98 |
| 2003/0151354 A1* | 8/2003 | Takizawa .......... | G02F 1/133553 313/498 |
| 2005/0130048 A1* | 6/2005 | Nakano .......... | G03F 7/0005 430/5 |
| 2007/0109472 A1* | 5/2007 | Chuang et al. ...... | 349/114 |
| 2007/0145892 A1* | 6/2007 | Chen .................. | 313/506 |
| 2011/0176304 A1* | 7/2011 | Kim .......... | H01L 51/5284 362/235 |
| 2011/0266577 A1 | 11/2011 | Kim et al. | |
| 2014/0002777 A1* | 1/2014 | Kim .......... | G02F 1/133362 349/106 |
| 2014/0118656 A1* | 5/2014 | Jang et al. .......... | 349/44 |
| 2014/0133027 A1* | 5/2014 | Jang et al. .......... | 359/485.03 |

FOREIGN PATENT DOCUMENTS

| | | |
|---|---|---|
| KR | 10-2004-0090301 A | 10/2004 |
| KR | 10-2010-0078354 A | 7/2010 |
| KR | 10-2012-0042549 A | 5/2012 |
| KR | 10-2012-0138037 A | 12/2012 |

\* cited by examiner

*Primary Examiner* — Matthew W Such
*Assistant Examiner* — David Spalla
(74) *Attorney, Agent, or Firm* — Lewis Roca Rothgerber Christie LLP

(57) ABSTRACT

An organic light-emitting display apparatus includes: a first substrate; a display unit on the first substrate, the display unit being divided into a pixel unit and a non-pixel unit located around the pixel unit; a first electrode having an island shape to correspond to the pixel unit; a second electrode facing the first electrode and over the pixel unit and the non-pixel unit; an organic light-emitting layer between the first electrode and the second electrode and to emit light toward the second electrode; a second substrate facing the second electrode and bonded with the first substrate; and a light output unit arranged as a part corresponding to the pixel unit and a light reflection unit arranged as a part corresponding to the non-pixel unit, wherein the light output unit and the light reflection unit are on an internal surface of the second substrate facing the second electrode.

16 Claims, 9 Drawing Sheets

ORGANIC LIGHT-EMITTING DISPLAY APPARATUS WITH ENHANCED LIGHT OUTPUT EFFICIENCY AND MANUFACTURING METHOD THEREOF

CROSS-REFERENCE TO RELATED APPLICATION

This application claims priority to and the benefit of Korean Patent Application No. 10-2013-0153209, filed on Dec. 10, 2013, in the Korean Intellectual Property Office, the disclosure of which is incorporated herein in its entirety by reference.

BACKGROUND

1. Field

One or more embodiments of the present invention relate to an organic light-emitting display apparatus with enhanced light output efficiency and a manufacturing method thereof.

2. Description of the Related Art

Since an organic light-emitting display apparatus using (utilizing) an organic light-emitting device has a relatively faster response speed than a comparable liquid crystal display apparatus that is currently widely commercialized, it may be better at implementing a moving picture. Also, since the organic light-emitting display apparatus autonomously emits light, it has a wide viewing angle and may provide high luminescence. Thus, the organic light-emitting display apparatus is taking center stage as a next-generation display apparatus.

The organic light-emitting display apparatus includes a display area (region) in which a picture or image is displayed, and a non-display area (region), a dead space in which a picture is not displayed. The display area includes a pixel unit emitting light and a non-pixel unit not emitting light, and there are active studies on externally outputting light emitted from the pixel unit with more efficiency.

SUMMARY

Aspects of one or more embodiments of the present invention are directed toward an organic light-emitting display apparatus with enhanced light output efficiency and a manufacturing method thereof.

Additional aspects will be set forth in part in the description which follows and, in part, will be apparent from the description, or may be learned by practice of the presented embodiments.

According to one or more embodiments of the present invention, an organic light-emitting display apparatus includes: a first substrate; a display unit on the first substrate, wherein the display unit is divided into a pixel unit to emit light externally and a non-pixel unit located around the pixel unit and to not emitting light; a first electrode having an island shape to correspond to the pixel unit; a second electrode facing the first electrode and arranged over the pixel unit and the non-pixel unit; an organic light-emitting layer arranged between the first electrode and the second electrode and to emit light toward the second electrode; a second substrate arranged to face the second electrode and bonded with the first substrate; and a light output unit arranged as a part corresponding to the pixel unit and a light reflection unit arranged as a part corresponding to the non-pixel unit, wherein the light output unit and the light reflection unit are on an internal surface of the second substrate facing the second electrode.

The light reflection unit may include a plurality of layers sequentially from the internal surface of the second substrate toward the second electrode, and the layers include: a first external light anti-reflective layer arranged on the internal surface of the second substrate and prevents external light from becoming reflected from an external surface of the second substrate; and a first light reflection layer arranged on the surface of the first external light anti-reflective layer and reflects the light emitted back to the second substrate toward the second electrode.

The light output unit may include a second external light anti-reflective layer laterally integrated with the first external light anti-reflective layer and a second light reflection layer laterally integrated with the first light reflection layer, the second external light anti-reflective layer and the second light reflection layer being formed sequentially from the internal surface of the second substrate toward the second electrode, and a plurality of slit patterns that enables the light emitted from the organic light-emitting layer to be externally emitted are formed into the second external light anti-reflective layer and the second light reflection layer.

The organic light-emitting display apparatus may further include a protective layer that is arranged on a surface of the second light reflection layer, is transparent and includes the slit patterns.

The first external light anti-reflective layer may include at least one of a black matrix, a metal nitride, and a metal oxide.

The first light reflection layer may include aluminum.

A surface of the first light reflection layer may be planar.

The organic light-emitting display apparatus may further include a diffused reflection layer on a surface of the first light reflection layer, wherein the diffused reflection layer causes the diffused reflection of the light emitted from the organic light-emitting layer.

The organic light-emitting display apparatus may further include a thin film transistor (TFT) that is arranged on the first substrate, is electrically coupled to the first electrode, and is overlapped with the first electrode to cover the first electrode.

A surface of the second electrode may be spaced from a surface of the light output unit and the light reflection unit.

According to one or more embodiments of the present invention, a method of manufacturing an organic light-emitting display apparatus includes providing a first substrate on which a display unit is located, wherein the display unit is divided into a pixel unit emitting light externally and a non-pixel unit located around the pixel unit and not emitting light; forming a first electrode having an island shape to correspond to the pixel unit; forming a second electrode facing the first electrode and arranged over the pixel unit and the non-pixel unit; forming an organic light-emitting layer arranged between the first electrode and the second electrode and emitting light toward the second electrode; forming a light reflection unit as a part corresponding to the non-pixel unit and a light output unit as a part corresponding to the pixel unit; and arranging a second substrate to allow an internal surface of the second substrate to face the second electrode and bonding the second substrate with the first substrate, wherein the light output unit and the light reflection unit are on the internal surface of the second substrate.

The forming of the light reflection unit and the light output unit may include: forming a first external light anti-reflective layer as a part corresponding to the light reflection unit and on the internal surface of the second substrate and forming a second external light anti-reflective layer laterally and integrally with the first external light anti-reflective layer as a part corresponding to the light output unit; forming a first light reflection layer on a surface of the first external light anti-reflective layer and forming a second light reflection layer laterally and integrally with the first light reflection layer as a part corresponding to the light output unit; forming a protective layer at least on a surface of second light reflection layer; and forming a plurality of slit patterns into the second external light anti-reflective layer, the second light reflection layer, and the protective layer.

The first external light anti-reflective layer and the second external light anti-reflective layer may include at least one of a black matrix, a metal nitride, and a metal oxide.

Each of the first light reflection layer and the second light reflection layer may include aluminum.

The method may further include forming a diffused reflection layer on a surface of the first light reflection, wherein the diffused reflection layer causes a diffused reflection of light emitted from the organic light-emitting layer.

The method may further include forming a thin film transistor (TFT) that is arranged on the first substrate, is electrically coupled to the first electrode, and is overlapped with the first electrode to cover the first electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
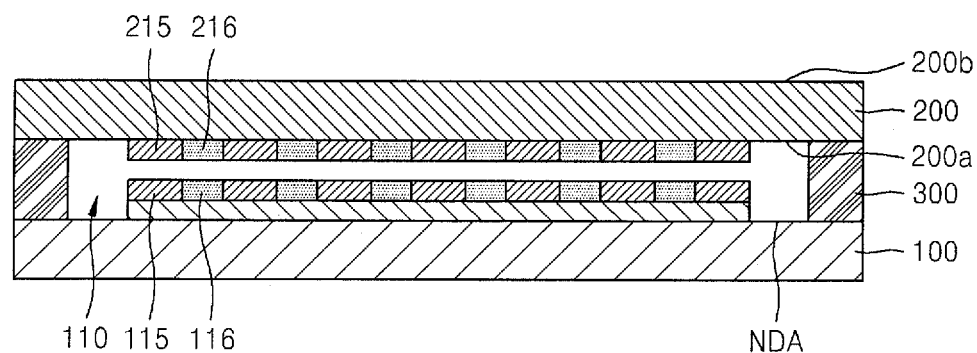
FIG. 1 is a schematic cross-section view of an organic light-emitting display apparatus according to an embodiment of the present invention.

Since the present invention makes various modifications and have several embodiments, particular embodiments will be illustrated in the drawings and described in the detailed description in more detail. The effects and features of the present invention, and implementation methods thereof will be clarified through following embodiments described with reference to the accompanying drawings. The present invention may, however, be embodied in different forms and should not be construed as limited to the embodiments set forth herein.

Embodiments of the present invention are described below in detail with reference to the accompanying drawings and when referring to the drawings, the same or similar components are denoted by the same reference numerals and are not repetitively described.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-section view of an organic light-emitting display apparatus according to an embodiment of the present invention.

Referring to FIG. 1, the organic light-emitting display apparatus according to an embodiment of the present invention includes a display unit 110 on a first substrate 100. The display unit 110 is an area (region) to display a picture, a plurality of pixel units 115 are included in the display unit 110 and each of the pixel units 115 emits light. The display unit 110 displays a picture by the pixel unit 115 that emits light in this way.

An area (region) around the display unit 110 is defined as a non-display area NDA. The non-display area NDA may include a bonding member that bonds a first substrate 100 to a second substrate 200. The non-display area NDA may also include various drivers for driving the pixel unit 115, though not shown.

The second substrate 200 is arranged to block external air and moisture from permeating the display unit 110 arranged on the first substrate 100. The second substrate 200 is bonded to the first substrate 100 by utilizing the bonding member 300 arranged at the edge of the first substrate 100 to seal the display unit 110. Absorbent, getter or filling member may be located in the space between the first substrate 100 and the second substrate 200. The second substrate 200 is formed of a transparent member so that a user located outside the substrate 200 may see a picture implemented on the display unit 110.

A light output unit 215 is arranged on a part of the internal surface 200a of the second substrate 200 (or as a part) that corresponds to the pixel unit 115 of the display unit 110, and a light reflection unit 216 is arranged on a part thereof (or as a part) corresponding to the non-pixel unit 116 of the display unit 1110. According to an embodiment of the present invention, since different optical components are arranged on a part of the second substrate corresponding to the pixel unit 115 and a part of the second substrate 200 corresponding to the non-pixel unit 116 as described above, it is possible to more efficiently output light emitted from the pixel unit 115 to the external surface 200b of the second substrate 200.

Figure 2:
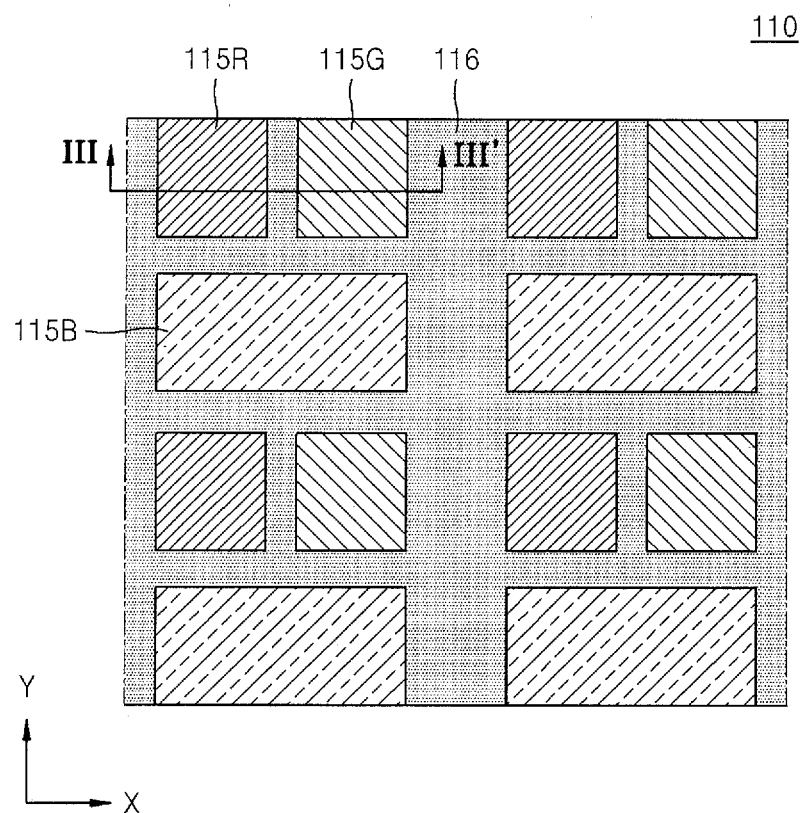
FIG. 2 is a schematic plan view of a portion of a display unit of FIG. 1.

FIG. 2 is a schematic plane view of a part of the display unit 110 of FIG. 1.

Referring to FIG. 2, the display unit 110 is divided into the pixel unit 115 emitting light toward the substrate 200 and the non-pixel unit 116 that is arranged around the pixel unit 115 and does not emit light. The display unit 110 may include a plurality of pixel units 115. For example, the display unit 110 may include a red pixel unit 115R emitting red light, a green pixel unit 115G emitting green light, and a blue pixel unit 115B emitting blue light. As such, a group including the red pixel unit 115R, the green pixel unit 115G, and the blue pixel unit 115B may form a unit pixel. The red pixel unit 115R, the green pixel unit 115G, and the blue pixel unit 115B may be arranged as shown in FIG. 2. The arrangement of FIG. 2 is however exemplary, and three pixel units 115 may be arranged along a line in the x-axis direction or in the y-axis direction. Also, the number or configuration of the pixel units 115 configuring the unit pixel is not limited to that shown in FIG. 2. For example, the unit pixel may also include four pixel units 115, the pixel units included in the unit pixel may further include white, scarlet or violet color in addition to the red, green and blue colors.

The non-pixel unit 116 is an area around the pixel unit. For example, the non-pixel unit 116 may also be arranged between different-color pixel units 115 or between unit pixels.

Figure 3:
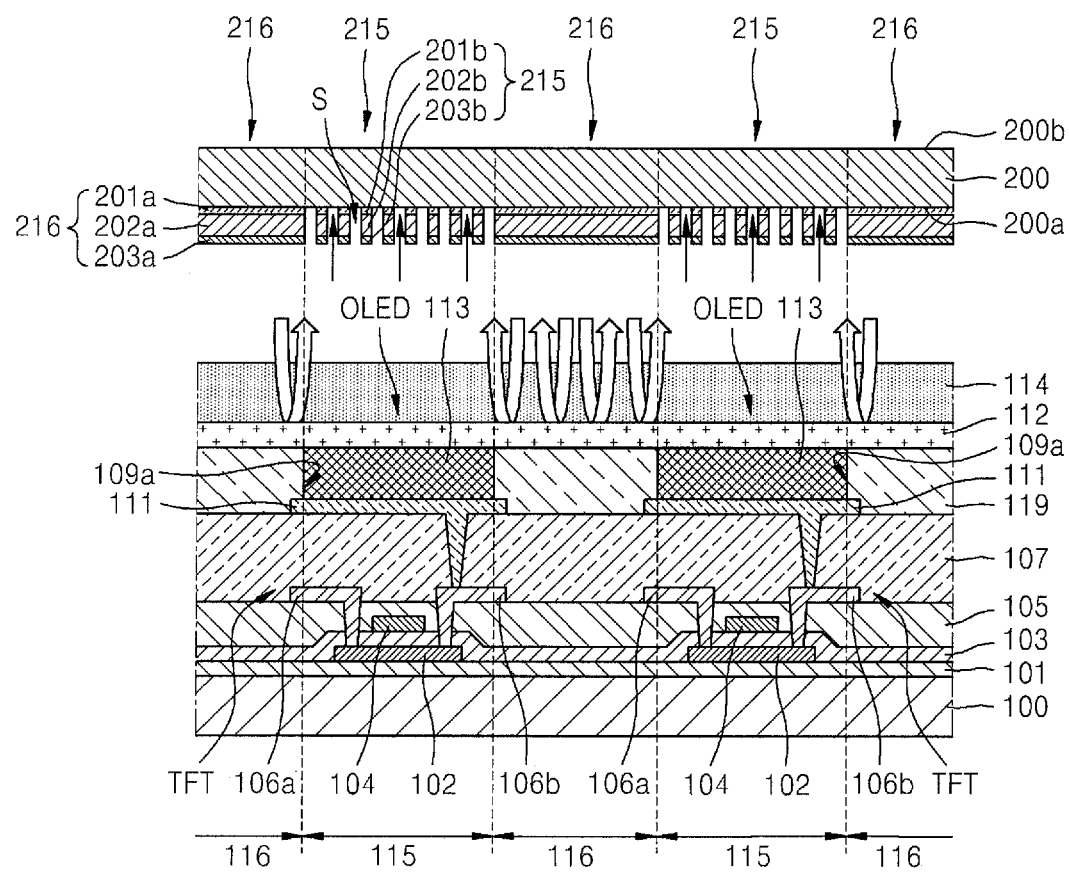
FIG. 3 is a schematic cross-section view taken along line III-III' of FIG. 2.

FIG. 3 is a schematic cross-section view taken along line III-III' of FIG. 2. FIGS. 4 to 9 are sequential cross-section views of a method of manufacturing the organic light-emitting display apparatus of FIG. 3. In the following, the sectional configuration of the display unit 110 of the organic light-emitting display apparatus according to an embodiment of the present invention and a detailed manufacturing method thereof are to be described with reference to FIGS. 3 to 9.

Figure 4:
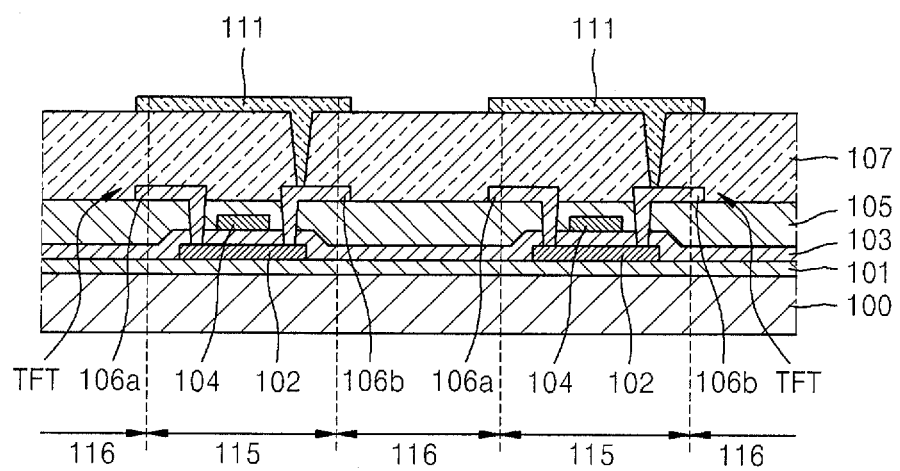
FIGS. 4 to 9 are sequential cross-section views of a method of manufacturing an organic light-emitting display apparatus of FIG. 3.

Referring to FIG. 4, the first substrate 100 is initially provided. The first substrate 100 plays the roles of wholly supporting the organic light-emitting display apparatus and maintaining its stiffness. A first top surface of the first substrate 100 is planar and the substrate may be formed of a transparent, insulating material. For example, the first substrate 100 may be formed of glass. However, an embodiment of the present invention is not limited thereto but the first substrate 100 may be formed of a plastic material such as polyethersulphone (PES), polyacrylate (PAR), or polyimide. On the other hand, the first substrate 100 may also be formed of an opaque material such as metal or carbon fiber.

A buffer layer 101 is formed on the first substrate 100. The buffer layer 101 makes a top surface planar and blocks an impurity from permeating. The buffer layer 101 may be formed as multiple layers or as a single layer that is (or are) formed of an inorganic material such as a silicon dioxide (SiOx) and/or a silicon nitride (SiNx), and may be formed through various deposition methods. The buffer layer 101 may be eliminated as designed.

A pixel circuit unit is formed on the buffer layer 101. The pixel circuit unit includes at least one thin film transistor (TFT). However, the pixel unit is not limited thereto but may further include at least one capacitor. In FIG. 3, one TFT per pixel unit 115 is shown for the convenience of description. However, this is just an example, and a pixel circuit corresponding to a pixel unit 115 may include at least two TFTs and at least one capacitor. On the other hand, FIG. 3 shows when the TFT is a top gate type (kind) in which the first substrate 100 sequentially includes an active layer 102, a gate electrode 104, and source and drain electrodes 106a and 106b. However, the present invention is not limited thereto but may employ various types (kinds) of TFTs such as a bottom gate type (kind).

The active layer 102 is formed on the buffer layer 101. The active layer 102 includes a semiconductor material and may include amorphous silicon or poly crystalline silicon, for example. However, the present invention is not limited thereto but may include a semiconductor material such as G-I—Z—O, e.g., $[a(In_2O_3)b(Ga_2O_3)c(ZnO)]$ (where, a, b and c are real numbers, and $a \geq 0$, $b \geq 0$, and $c > 0$). In addition to the G-I—Z—O, the active layer 102 may include 12-group, 13-group, and 14-group metal elements such as zinc (Zn), indium (In), gallium (Ga), tin (Sn), cadmium (Cd), germanium (Ge), or hafnium (Hf) and an oxide of a material selected from a combination thereof. The active layer 102 includes source and drain areas (regions) with which the source electrode 106a and the drain electrode 106b respectively come into contact, and a channel area (region) which is located therebetween. When the active layer 102 includes amorphous silicon or poly crystalline silicon, an impurity may be doped on the source area and the drain area as needed.

A gate insulating layer 103 is formed on the active layer 102 and may be formed as multiple layers or as a single layer that is (or are) formed of an inorganic material such as silicon dioxide and/or silicon nitride. The gate insulating layer 103 plays the role of insulating the active layer 102 from the gate electrode 104.

The gate electrode 104 is formed on the gate insulating layer 103. The gate electrode 104 is coupled to a gate line that applies an ON or OFF signal to the TFT. The gate electrode 104 may be formed of a low-resistive metal and may be formed as multiple layers or as a single layer that is (or are) formed of a conductive material including, e.g., molybdenum (Mo), aluminum (Al), copper (Cu), or titanium (Ti).

An interlayer dielectric 105 is formed on the gate electrode 104. The interlayer dielectric 105 plays the role of insulating the source electrode 106a, the drain electrode 106b, and the gate electrode 104. The interlayer dielectric 105 may be formed as multiple layers or as a single layer that is (or are) formed of an inorganic material. For example, the inorganic material may be a metal oxide or a metal nitride, and in particular, the inorganic material may include a silicon dioxide (e.g., $SiO_2$), a silicon nitride (e.g., SiNx), a silicon oxynitride (e.g., SiOxNy), an aluminum oxide (e.g., $Al_2O_3$), a titanium oxide (e.g., $TiO_2$), a tantalum oxide (e.g., $Ta_2O_5$), a hafnium oxide (e.g., $HfO_2$), and/or a zirconium oxide (e.g., $ZrO_2$).

The source electrode 106a and the drain electrode 106b are formed on the interlayer dielectric 105. For example, the source electrode 106a and the drain electrode 106b may be formed as multiple layers or as a single layer that is (or are) formed of a conductive material including molybdenum (Mo), aluminum (Al), copper (Cu), and/or titanium (Ti). The source electrode 106a and the drain electrode 106b respectively come into contact with the source area and the drain area of the active layer 102 through contact holes formed in the interlayer dielectric 105 and the gate insulating layer 103.

Next, a planarization layer 107 is formed to cover such a TFT. The planarization layer 107 removes a height difference resulting from the TFT, planarizes a top surface and prevents an organic light-emitting diode (OLED) from having a defect due to unevenness. Such a planarization layer 107 may be formed as multiple layers or a single layer that is (or are) formed of an inorganic material and/or an organic material. For example, the inorganic material may be a metal oxide or a metal nitride, and in particular, the inorganic material may include a silicon dioxide (e.g., $SiO_2$), a silicon nitride (e.g., SiNx), a silicon oxynitride (e.g., SiOxNy), an aluminum oxide (e.g., $Al_2O_3$), a titanium oxide (e.g., $TiO_2$), a tantalum oxide (e.g., $Ta_2O_5$), a hafnium oxide (e.g., $HfO_2$), and/or a zirconium oxide (e.g., $ZrO_2$). On the other hand, the organic material may include a commercial polymer such as polymethylmethacrylate (PMMA) or polystyrene (PS), a polymer derivative having a phenol based group, an acryl based polymer, an imide based polymer, an arylether based polymer, an amide based polymer, a fluorine based polymer, a p-xylene based polymer, a vinylalcohol based polymer, or blends thereof. The planarization layer 107 may also be formed as a composite laminate of an inorganic insulating layer and an organic insulating layer.

Next, an OLED is formed on the planarization layer 107. In particular, the OLED includes a pixel electrode 111, an opposite electrode 112 and an intermediate layer 113 between both electrodes 111 and 112. According to a direction in which the OLED emits light, a display apparatus is classified into a bottom emission type (kind), a top emission type (kind), and a dual emission type (kind). In the bottom emission type, the pixel electrode 111 is a transmissive electrode and the opposite electrode 112 is a reflective electrode. In the top emission type, the pixel electrode 111 is a reflective electrode and the opposite electrode 112 is a transflective electrode. In the dual emission type, both the pixel electrode 111 and the opposite electrode 112 are transmissive electrodes. In FIG. 3, the organic light-emitting display apparatus is in the top emission type.

The pixel electrode 111 may be patterned and formed in an island form corresponding to each pixel unit 115. Also, the pixel electrode 111 is formed to come into contact with the TFT included in a pixel circuit through the hole of the planarization layer 107. On the other hand, the pixel electrode 111 may be arranged to be overlapped with the TFT to cover the pixel circuit located thereunder.

The pixel electrode 111 includes a reflective electrode layer in addition to a transparent electrode layer so that light may be emitted toward the opposite electrode 112. When the pixel electrode 111 functions as an anode, the transparent electrode layer may include at least one material selected from a group including a transparent, conductive oxide such as an indium tin oxide (ITO), an indium zinc oxide (IZO), a zinc oxide (e.g., ZnO), an indium oxide (e.g., $In_2O_3$), an indium gallium oxide (IGO), and an aluminum zinc oxide (AZO) which have great work functions. The reflective electrode layer may include metal having high reflectivity such as silver (Ag).

Figure 5:
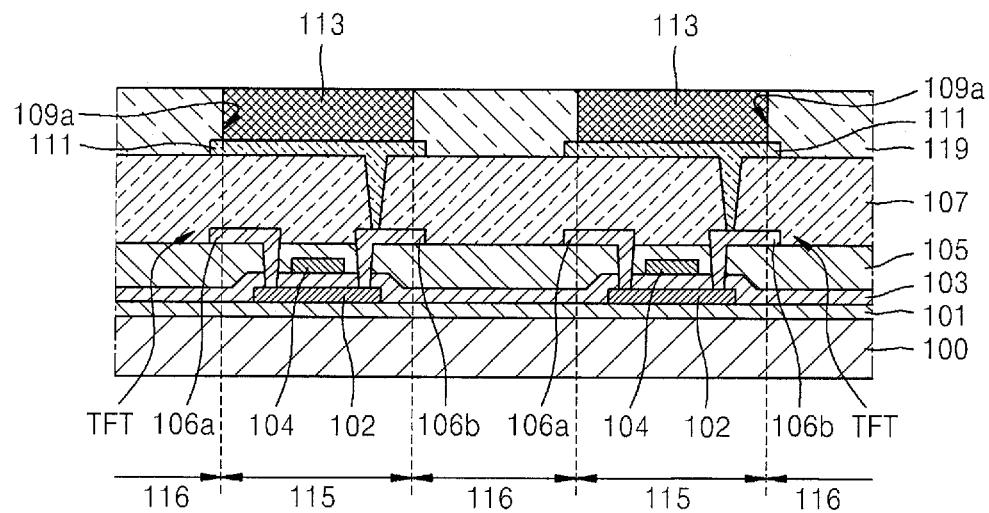

Next, referring to FIG. 5, a pixel defining layer 109 is formed on the planarization layer 107. The pixel defining layer 109 may be formed of one or more organic insulating materials selected from a group including polyimide, polyamide, acryl resin, benzocyclobutene and phenol resin, by using a spin coating method. The pixel defining layer 109 includes an opening 109a that covers the edge of the pixel electrode 111 and opens at least the central part thereof. An area defined by the opening 109a corresponds to the pixel unit 115 and the intermediate layer 113 is formed in the area.

The intermediate layer 113 includes an organic emission layer emitting red, green or blue light, and the organic emission layer may use a small-molecular organic material or a polymeric organic material. When the organic emission layer is a small-molecular organic layer formed of a small-molecular organic material, the organic emission layer takes a reference position with a hole transport layer (HTL) and a hole injection layer (HIL) located (laminated) toward the pixel electrode 111 and an electron transport layer (ETL) and an electron injection layer (EIL) located (laminated) toward the opposite electrode 112. Various layers in addition to the HIL, the HTL, the ETL, and the EIL may also be located (laminated) and formed as needed.

Also, a case where a separate organic emission layer is formed for each pixel unit 115 is described in the embodiment above. Here, pixel units 115 may emit red, green and blue light, respectively. However, the present invention is not limited thereto but the organic emission layer may be formed in common for all the pixel units 115. For example, a plurality of organic emission layers that emit light red, green and blue light may be vertically laminated or mixed to emit white light. A combination of colors for emitting white light is not limited to that described above. On the other hand, a color conversion layer or a color filter that converts the emitted white light into a certain color may be separately included.

Figure 6:
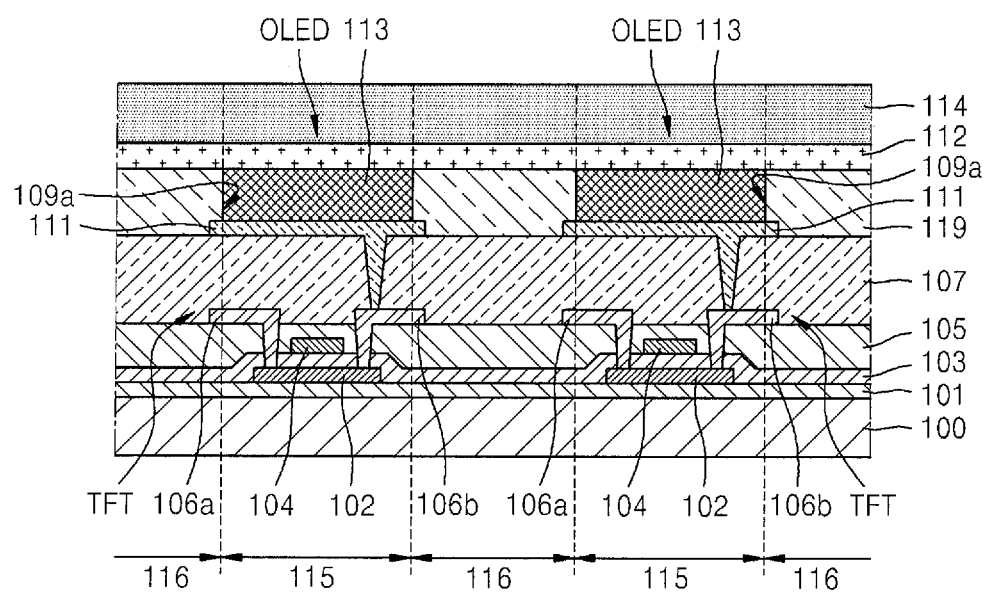

Next, referring to FIG. 6, the opposite electrode 112 is formed to cover both the pixel unit 115 and the non-pixel unit 116. The opposite electrode 112 may be formed of a conductive inorganic material. When the opposite electrode 112 functions as a cathode, it may be formed of Li, Ca, LiF/Ca, LiF/Al, Al, Mg, and/or Ag that have small work functions, and may be formed as a thin film to be able to transmit light.

The opposite electrode 112 may be formed as a common electrode over the entire display unit 110 on which a picture is implemented. In this case, the opposite electrode 112 may be formed in an evaporation process in which the intermediate layer 113 is not damaged. On the other hand, the polarities of the pixel electrode 111 and the opposite electrode 112 may be reversed.

An insulating capping layer 114 may be further formed on the opposite electrode 112. When forming an encapsulation thin film by using (utilizing) a sputtering process or a plasma enhanced chemical vapor deposition (PECVD) process, the insulating capping layer 114 may maintain the work function of the opposite electrode 112 and prevent an organic material included in the intermediate layer 113 from becoming damaged. The insulating capping layer 114 is optional and may not be included.

It is possible to manufacture the display unit 110 on the first substrate 100 through the above-described processes. In the following, the structure of the second substrate 200 with the light output unit 215 and the light reflection unit 216 according to an embodiment of the present invention and a manufacturing method thereof are discussed with reference to FIGS. 7 and 8.

Figure 7:
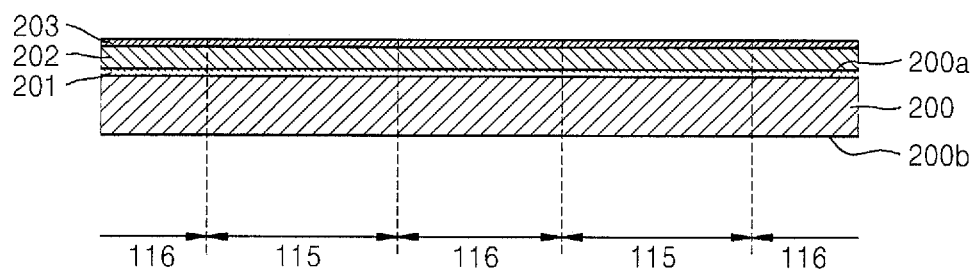

Referring to FIG. 7, the second substrate 200 is firstly provided. The second substrate 200 may be formed of a transparent, insulating material to be able to transmit light emitted from an OLED. For example, the second substrate 200 may be formed of glass. When the second substrate 200 is bonded to the first substrate 100, the second substrate 200 may be divided into a part on which the light outputting unit 215 corresponding to the pixel unit 115 of the display unit 110 is arranged, and a part on which the light reflection unit 216 corresponding to the non-pixel unit 116 of the display unit 110 is arranged.

Next, an external light anti-reflective layer 201 is wholly formed on the internal surface 200a of the second substrate 200. When a user located on the external surface 200b that is the opposite side of the internal surface 200a of the second substrate 200 observes an organic light-emitting display apparatus, the external light anti-reflective layer 201 prevents external light from becoming reflected to a user side of the external surface 200b of the second substrate 200 and thus prevents the picture on the display unit 110 from becoming unclearly observed. The external light anti-reflective layer 201 is formed of a material having low reflectivity in order to prevent external light from becoming reflected. For example, the external light anti-reflective layer 201 may be formed of at least one of a black matrix, a metal nitride and a metal oxide. In the case of the metal nitride, e.g., a titanium nitride (e.g., TiNx), a molybdenum nitride (e.g., MoNx), and a copper nitride (e.g., CuNx) may be employed and in particular, in the case of the titanium nitride, it is possible to experimentally ascertain that the reflectivity of external light is less than 10% when the thickness of the titanium nitride is about 30 nm to 70 nm. A titanium oxide (e.g., TiOx) and/or an indium zinc oxide (IZO) may be employed as the metal oxide. The external light anti-reflective layer 201 may be formed as a single layer or a composite layer that is formed of the above-described materials.

Next, a light reflection layer 202 is formed on the surface of the external light anti-reflective layer 201. The light reflection layer 202 plays the roles of reflecting light emitted from an OLED toward the second substrate 200 to the opposite electrode 112 and inducing the reflected light so that the reflected light may be reflected by the opposite electrode 112 and go out through the light output unit 215. The roles of the light reflection layer 202 are described in more detail below. The light reflection layer 202 is formed of a material having high reflectivity to effectively reflect light emitted from the organic light-emitting display apparatus. For example, the light reflection layer 202 may be formed of aluminum (Al). Since the aluminum has a significantly great extinction coefficient as compared to other metals, it may efficiently reflect light.

Next, a protective layer 203 is formed on the surface of the light reflection layer 202. The protective layer 203 protects the light reflection layer 202 and functions as a mask when a plurality of slit patterns is later formed as (or on) a part corresponding to the light output unit 215 of the light reflection layer 202. The protective layer 203 is formed of a transparent material in order not to affect the reflection of light. For example, the protective layer 203 may be formed of a silicon oxide (e.g., SiOx).

Figure 8:
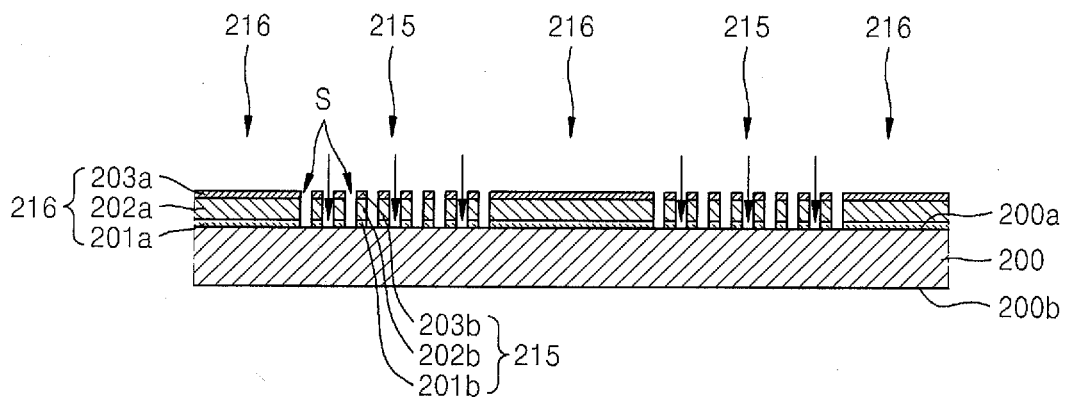

Next, referring to FIG. 8, the light reflection unit 216 and the light output unit 215 are formed. As described above, the light reflection unit is formed as (or on) a part corresponding to the non-pixel unit 116 of the display unit 110, and the light output unit 215 is formed as (or on) a part corresponding to the pixel unit 115 of the display unit 110. Since the light reflection unit 216 is used for reflecting light emitted from an OLED toward the opposite electrode 112, it does not need a part to transmit light toward the second substrate 200. However, since the light output unit 215 is used (utilized) for enabling both light emitted from the OLED and light reflected from the light reflection unit 216 to be emitted to the outside of the second substrate 200, it needs a path through which light may pass. Thus, the light output unit 215 includes a plurality of slit patterns S through which light may pass to the outside. Such slit patterns S are through-formed into the external light anti-reflective layer 201, the light reflection layer 202 and the protective layer 203 as through-openings (e.g., through-holes). Further, the slit patterns S in the light output unit 215 functions as a polarizer of the organic light-emitting display apparatus.

A detailed method for forming the light output unit 215 and the light reflection unit 216 is as follows. Initially, the protective layer 203 that is arranged on a part where the light output unit 215 is formed is patterned into a plurality of slit patterns S. The protective layer 203 may be patterned by using (utilizing) various known methods. As an example, a polymer layer including PET, PC, and PEN is formed on the protective layer 203 to be about two to four times thicker than the protective layer 203, and then a master mold corresponding to the reverse pattern of the slits presses the polymer layer. The polymer layer is cured to form a cured polymer layer having a plurality of slit patterns. Then, the protective layer 203 is patterned by using (utilizing) the cured polymer layer as a mask. In addition, the light reflection layer 202 and the external light anti-reflective layer 201 are patterned by using the patterned protective layer as a mask. On the other hand, since patterns should not be formed on the light reflection unit 216, a masking operation is previously performed on the protective layer 203 arranged on a part where the light reflection unit 216 is formed, by using (utilizing), e.g., a photoresist PR material. As a result, the surfaces of the external light anti-reflective layer 201, the light reflection layer 202, and the protective layer 203 located on the light reflection unit 216 are maintained in a planar state, while a plurality of slit patterns S that may transmit light to the outside is formed into the external light anti-reflective layer 201, the light reflection layer 202, and the protective layer 203 located on the light output unit 215. In this example, the height of the slit pattern S may be about 50 nm to 200 nm, its width may be about 100 nm to 150 nm, and the gap between slits S may be about 10 nm to 100 nm, but the present invention is not thereby limited.

The external light anti-reflective layer 201, the light reflection layer 202, and the protective layer 203 that are located at the light reflection unit 216 are referred to as a first external light anti-reflective layer 201a, a first light reflection layer 202a, and a first protective layer 203a, and the external light anti-reflective layer 201, the light reflection layer 202, and the protective layer 203 that are located at the light output unit 215 are referred to as a second external light anti-reflective layer 201b, a second light reflection layer 202b, and a second protective layer 203b. The reason is to distinguish the same members for different components.

Figure 9:
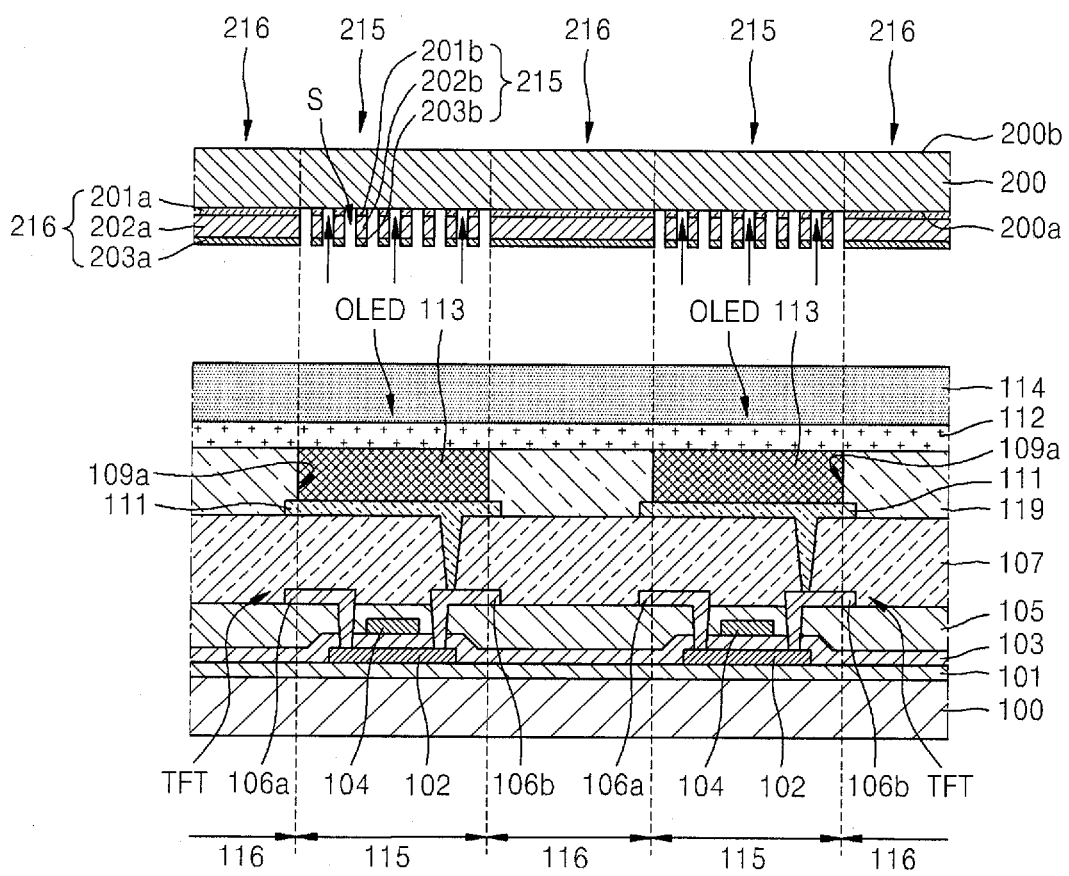

Referring to FIG. 9, the second substrate 200 with the light output unit 215 and the light reflection unit 216 is bonded to the first substrate 100. In this case, the internal surface 200a of the second substrate 200 with the light output unit 215 and the light reflection unit 216 is arranged to face the second electrode, and as shown in FIG. 1, both substrates are bonded through the bonding member 300 arranged at the edge of the first substrate 100.

In the following, how much the light output efficiency of an organic light-emitting display apparatus according to an embodiment of the present invention of FIG. 3 is improved is discussed by using (utilizing) an organic light-emitting display apparatus using (utilizing) the second substrate 200 with only the light output unit 215, not the light reflection unit 216 as a comparative example.

Figure 10:
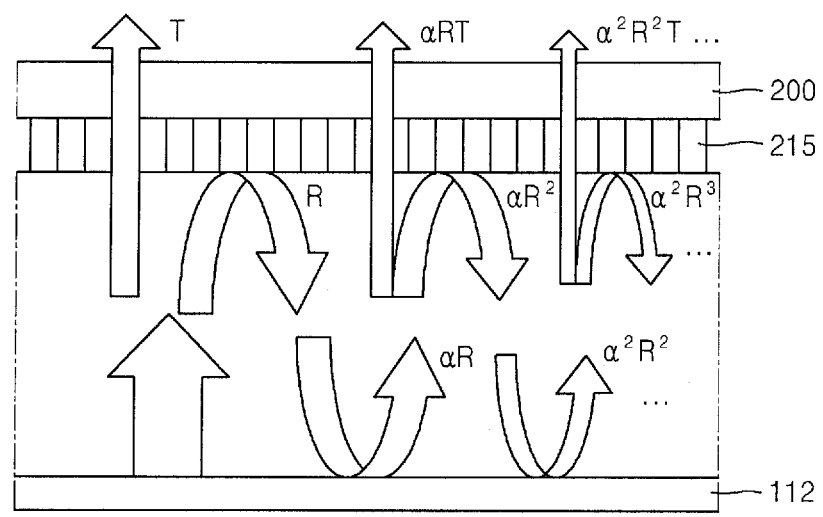
FIG. 10 represents light output efficiency of an organic light-emitting display apparatus according to a comparative example of the present invention.

FIG. 10 represents light output efficiency of an organic light-emitting display apparatus according to a comparative example of the present invention.

Referring to FIG. 10, the total transmittance of light emitted from an organic light-emitting display apparatus according to a comparative example satisfies Equation 1 below.

$$T_{total(1)} = T + \alpha RT + \alpha^2 R^2 T + \ldots = T/(1-\alpha R)$$ Equation 1

In Equation 1, T is the transmittance of P (parallel) polarization of the light output unit, R is the reflectivity of S (senkrecht) polarization of the light output unit, and a is the recycling efficiency of the opposite electrode. In this example, the recycling efficiency may refer to a ratio that light emitted from an OLED re-enters the opposite electrode, is reflected from the opposite electrode and enters the second substrate.

When drawing a luminescence gain by the light output unit of a comparative example from Equation 1, Equation 2 below is obtained.

$$E(1) = T_{total(1)}/T = 1/(1-\alpha R)$$ Equation 2

Figure 11:
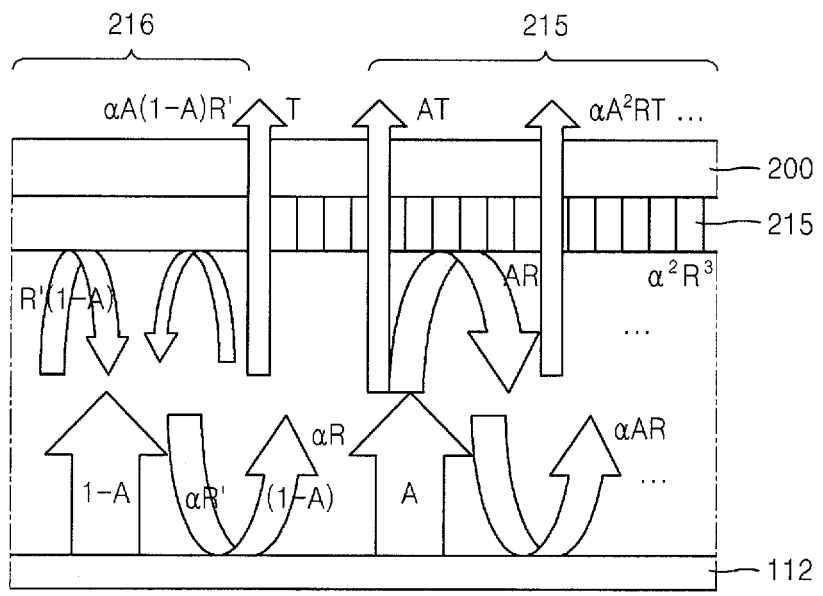
FIG. 11 represents light output efficiency of an organic light-emitting display apparatus according to an embodiment of the present invention.

FIG. 11 represents light output efficiency of an organic light-emitting display apparatus according to an embodiment of the present invention.

Referring to FIG. 11, the total transmittance of light emitted from an organic light-emitting display apparatus according to an embodiment of the present invention satisfies Equation 3 below.

$$T_{total(3)} = AT/[1-\{\alpha AR + \alpha(1-A)R'\}]$$ Equation 3

In Equation 3, T is the transmittance of P polarization of the light output unit, R is the reflectivity of S polarization of the light output unit, α is the recycling efficiency of the opposite electrode, and A is an aperture defined by a plurality of slit patterns formed on the light output unit. Since an embodiment of the present invention includes a light reflection unit unlike the comparative example, reflectivity by the light reflection unit is further considered.

When drawing a luminescence gain by the light output unit and the light reflection unit of the present embodiment from Equation 3, Equation 4 below is obtained.

$$E(2)=T_{total(1)}/AT=1/[1-\{\alpha AR+\alpha(1-A)R'\}]$$ Equation 4

Here, in some cases, when the recycling efficiency of the opposite electrode in the comparative example is determined by Equation 2 drawn as above is limited to some cases, the luminescence gain is shown in Table 1 below.

TABLE 1

| | Recycling efficiency of opposite electrode ($\alpha$) | | |
|---|---|---|---|
| | 0.7 | 0.6 | 0.5 |
| Luminescence gain | 1.45 | 1.36 | 1.29 |

Figure 12:
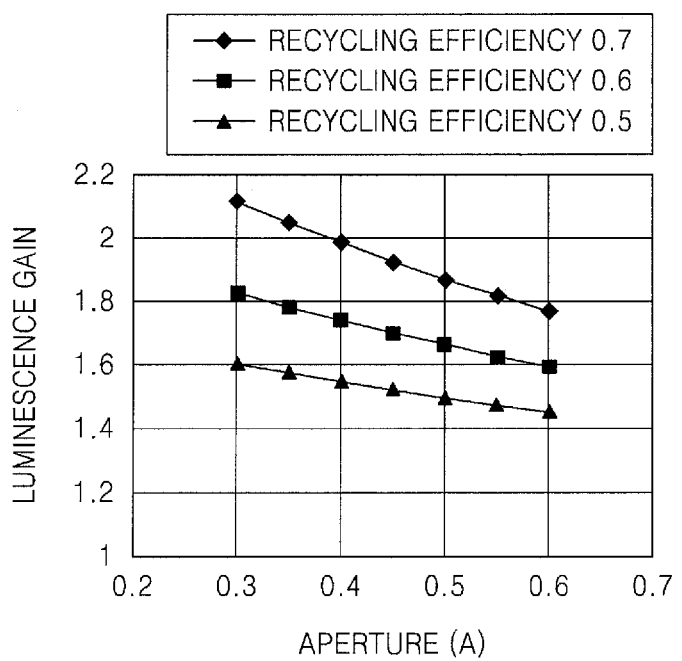
FIG. 12 is a graph representing a luminescence gain of an organic light-emitting display apparatus according to an embodiment of the present invention.

Also, in some cases, when the recycling efficiency and the aperture of the opposite electrode in the embodiment are determined by Equation 4, the luminescence gain is shown in FIG. 12. Referring to FIG. 12, when the aperture A of the embodiment is within about 30% to 60% with the recycling efficiencies of the opposite electrodes of the comparative example and the embodiments are the same, it can be seen that the luminescence gain of the embodiment is always better. That, it may be seen that the embodiment including both the light output unit and the light reflection unit has higher light output efficiency than the comparative example including only the light output unit. The reason is because it is possible to recycle light reflected from the non-pixel unit by using (utilizing) the total refection of the reflection unit. Thus, the embodiment has higher light output efficiency than the comparative example not including the reflection unit.

Figure 13:
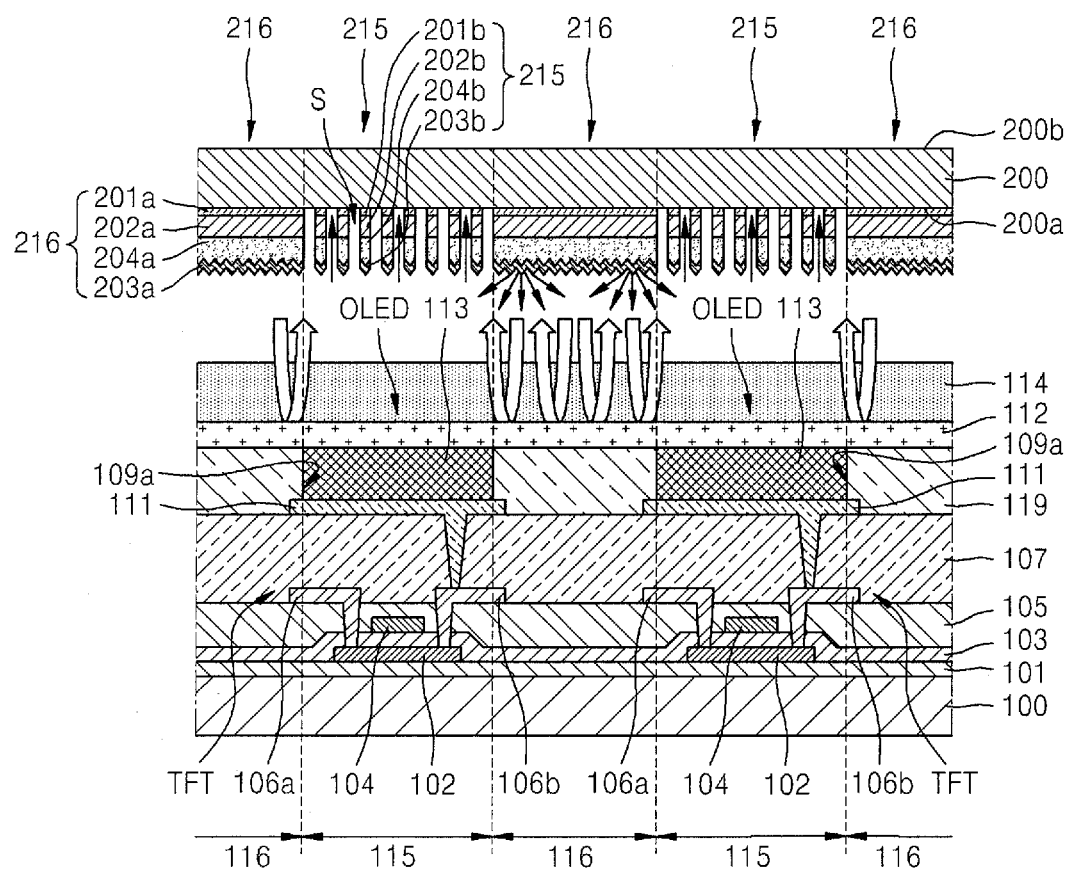
FIG. 13 is a cross-section view of an organic light-emitting display apparatus according to another embodiment of the present invention.

FIG. 13 is a cross-section view of the display unit 110 of an organic light-emitting display apparatus according to another embodiment of the present invention.

Referring to FIG. 13, the embodiment of FIG. 13 is different from that of FIG. 3 in that the surface of the first light reflection layer 202a is planar and a diffused reflection structure 204a is further formed on the surface of the first light reflection layer 202a. Since other components are the same as those of FIG. 3, only the diffused reflection structure 204a of FIG. 13 is described in more detail and the same descriptions provided in the embodiment of FIG. 3 are not provided again.

In the embodiment of FIG. 3, a part of light emitted from an OLED may be trapped by the light reflection unit 216 arranged to correspond to the non-pixel unit and may not leave. For example, if operations (in which a part of a light emitted from the OLED is reflected to the opposite electrode corresponding to the non-pixel unit by the light reflection unit 216 and this part of the light is again reflected to the light reflection unit 216) are repeated, light may not be externally output through the light output unit 215 in some cases. In order to externally output such light more efficiently, a diffused reflection structure is formed on the surface of the first light reflection layer 202a corresponding to the non-pixel unit.

The diffused reflection structure 204a may be formed in a micro, uneven pattern, and may refer to a structure that enables diffused reflection in all directions.

Figure 14A:
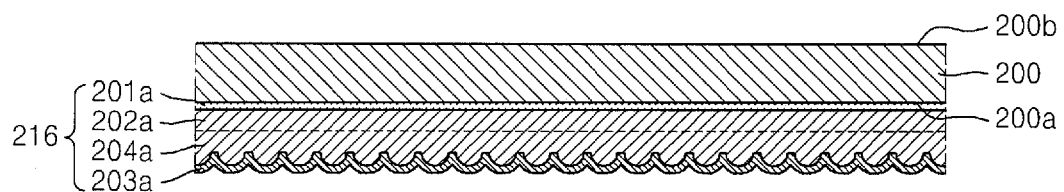
FIGS. 14A to 14C show various examples of a diffused-reflection structure pursuant to embodiments of the present invention.
Figure 14B:
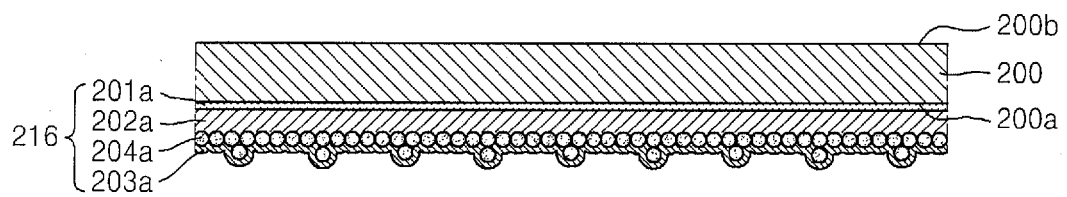
Figure 14C:
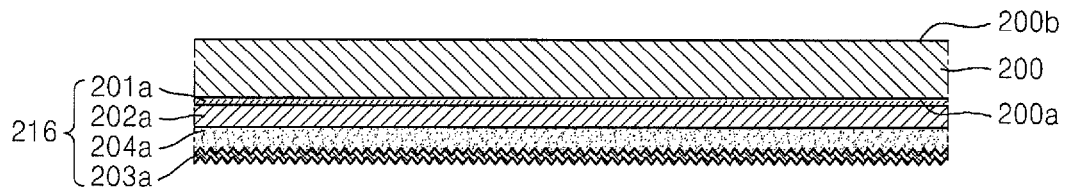

FIGS. 14A to 14C show various examples of a diffused-reflection structure 204a pursuant to embodiments of the present invention.

Referring to FIG. 14a, the diffused reflection structure 204a is formed of the same material as the first light reflection layer 202a. In this example, the first light reflection layer 202a is formed to be relatively thick, then photoresist is applied on the surface of the thick first light reflection layer 202a, and thermal treatment is performed so that the photoresist rolls down. Then, a micro, uneven structure is formed on the first light reflection layer 202a through an etch process.

Referring to FIG. 14b, the diffused reflection structure 204a is a nano particle formed on the first light reflection layer 202a. In this example, the diffused reflection structure is formed in such a manner that a nano particle including a metal having high reflectivity is stacked on the first light reflection layer 202a.

Referring to FIG. 14c, the diffused reflection structure 204a is a polymeric pattern formed on the first light reflection layer 202a. In this example, a polymeric material is applied on the first light reflection layer 202a and a micro, uneven pattern is formed by using (utilizing) a nano imprint method.

As such, according to an embodiment of the present invention, since the light output unit is formed on a part corresponding to the pixel unit of the display unit among the internal surfaces of the second substrate included in the organic light-emitting display apparatus and the light reflection unit is formed on a part corresponding to the non-pixel unit thereof, light output efficiency is enhanced. Here, the light reflection unit only needs to be included in a part corresponding to the non-pixel unit and the area of the light reflection unit may be narrower or the same as that of a part corresponding to the non-pixel unit depending on the viewing angle of the OLED.

According to an embodiment of the present invention, when the viewing angle of the OLED is experimentally smaller than or equal to about 70°, the light reflection unit may be arranged on the whole area corresponding to the non-pixel unit of the second substrate. However, when the viewing angle is equal to or greater than about 80°, it is possible to enhance light output efficiency when the light reflection unit is arranged only on a part of an area corresponding to the non-pixel unit of the second substrate.

Also, according to an embodiment of the present invention, if the viewing angle of the OLED and the gap between the second substrate and the OLED are determined, it is possible to determine the gap between the light output unit and the light reflection unit. This may be determined in a similar way whether or not a polarizer is arranged on the external surface of the second substrate.

As described above, according to the one or more of the above embodiments of the present invention, the output efficiency of light emitted from the OLED is enhanced, and the slit patterns S in the light output unit 215 replace a polarizer.

As such, although the present invention is described with reference to embodiments shown in the drawings, they are just examples and a person skilled in the art will understand that various variations may be made therefrom. Thus, the true protective scope of the present invention will be defined by the technical spirit of the following claims, and equivalents thereof.

What is claimed is:

1. An organic light-emitting display apparatus, comprising:
   a first substrate;
   a display unit on the first substrate, wherein the display unit is divided into a pixel unit to emit light externally and a non-pixel unit located around the pixel unit and to not emit light;
   a first electrode having an island shape to correspond to the pixel unit;
   a second electrode facing the first electrode and arranged over the pixel unit and the non-pixel unit;

an organic light-emitting layer arranged between the first electrode and the second electrode and to emit light toward the second electrode;

a second substrate arranged to face the second electrode and bonded with the first substrate; and a light output unit arranged as a part corresponding to the pixel unit and a light reflection unit arranged as a part corresponding to the non-pixel unit, wherein the light output unit and the light reflection unit are on an internal surface of the second substrate facing the second electrode, wherein the light output unit comprises a plurality of slit patterns to enable the light emitted from the organic light-emitting layer to be externally emitted, the light reflection unit does not comprise any slit patterns, and the light output unit and the light reflection unit form a same layer.

2. The organic light-emitting display apparatus of claim 1, wherein the light reflection unit comprises a plurality of layers sequentially from the internal surface of the second substrate toward the second electrode, and the layers comprise:

a first external light anti-reflective layer arranged on the internal surface of the second substrate and to prevent external light from becoming reflected from an external surface of the second substrate; and a first light reflection layer arranged on the surface of the first external light anti-reflective layer and to reflect the light emitted toward the second substrate back to the second electrode.

3. The organic light-emitting display apparatus of claim 2, wherein the light output unit comprises a second external light anti-reflective layer laterally integrated with the first external light anti-reflective layer and a second light reflection layer laterally integrated with the first light reflection layer, the second external light anti-reflective layer and the second light reflection layer being formed sequentially from the internal surface of the second substrate toward the second electrode, and the plurality of slit patterns that enables the light emitted from the organic light-emitting layer to be externally emitted are formed into the second external light anti-reflective layer and the second light reflection layer.

4. The organic light-emitting display apparatus of claim 3, further comprising a protective layer arranged on a surface of the second light reflection layer, being transparent and comprises the slit patterns.

5. The organic light-emitting display apparatus of claim 2, wherein the first external light anti-reflective layer comprises at least one of a black matrix, a metal nitride, and a metal oxide.

6. The organic light-emitting display apparatus of claim 2, wherein the first light reflection layer comprises aluminum.

7. The organic light-emitting display apparatus of claim 2, wherein a surface of the first light reflection layer is planar.

8. The organic light-emitting display apparatus of claim 2, further comprising a diffused reflection layer on a surface of the first light reflection layer, wherein the diffused reflection layer is configured to diffuse a reflection of the light emitted from the organic light-emitting layer.

9. The organic light-emitting display apparatus of claim 1, further comprising a thin film transistor (TFT) arranged on the first substrate, electrically coupled to the first electrode, and overlapped with the first electrode to cover the first electrode.

10. The organic light-emitting display apparatus of claim 1, wherein a surface of the second electrode is spaced from a surface of the light output unit and the light reflection unit.

11. A method of manufacturing an organic light-emitting display apparatus, the method comprising:

providing a first substrate on which a display unit is located, wherein the display unit is divided into a pixel unit to emit light externally and a non-pixel unit located around the pixel unit and to not emit light;

forming a first electrode having an island shape to correspond to the pixel unit;

forming a second electrode facing the first electrode and arranged over the pixel unit and the non-pixel unit;

forming an organic light-emitting layer arranged between the first electrode and the second electrode and to emit light toward the second electrode;

forming a light reflection unit as a part corresponding to the non-pixel unit and a light output unit as a part corresponding to the pixel unit; and arranging a second substrate to allow an internal surface of the second substrate to face the second electrode and bonding the second substrate with the first substrate, wherein the light output unit and the light reflection unit are on the internal surface of the second substrate, wherein the forming of the light output unit comprises forming a plurality of slit patterns in the light output unit, and wherein the light reflection unit does not comprise any slit patterns, and the light output unit and the light reflection unit form a same layer.

12. A method of manufacturing an organic light-emitting display apparatus, the method comprising:

providing a first substrate on which a display unit is located, wherein the display unit is divided into a pixel unit to emit light externally and a non-pixel unit located around the pixel unit and to not emit light;

forming a first electrode having an island shape to correspond to the pixel unit;

forming a second electrode facing the first electrode and arranged over the pixel unit and the non-pixel unit;

forming an organic light-emitting layer arranged between the first electrode and the second electrode and to emit light toward the second electrode;

forming a light reflection unit as a part corresponding to the non-pixel unit and a light output unit as a part corresponding to the pixel unit; and arranging a second substrate to allow an internal surface of the second substrate to face the second electrode and bonding the second substrate with the first substrate, wherein the light output unit and the light reflection unit are on the internal surface of the second substrate, wherein the forming of the light reflection unit and the light output unit comprises;

forming a first external light anti-reflective layer as a part corresponding to the light reflection unit and on the internal surface of the second substrate and forming a second external light anti-reflective layer laterally and integrally with the first external light anti-reflective layer as a part corresponding to the light output unit;

forming a first light reflection layer on a surface of the first external light anti-reflective layer and forming a second light reflection layer laterally and integrally with the first light reflection layer as a part corresponding to the light output unit;

forming a protective layer at least on a surface of second light reflection layer; and forming a plurality of slit patterns into the second external light anti-reflective layer, the second light reflection layer, and the protective layer.

13. The method of claim 12, wherein the first external light anti-reflective layer and the second external light anti-reflective layer comprises at least one of a black matrix, a metal nitride, and a metal oxide.

14. The method of claim 12, wherein each of the first light reflection layer and the second light reflection layer comprises aluminum.

15. The method of claim 12, further comprising forming a diffused reflection layer on a surface of the first light reflection, wherein the diffused reflection layer is configured to diffuse a reflection of light emitted from the organic light-emitting layer.

16. The method of claim 11, further comprising forming a thin film transistor (TFT) arranged on the first substrate, electrically coupled to the first electrode, and overlapped with the first electrode to cover the first electrode.

\* \* \* \* \*